United States Patent
Suljic et al.

(10) Patent No.: US 11,409,348 B2
(45) Date of Patent: Aug. 9, 2022

(54) POWER BACKUP ARCHITECTURE TO MANAGE CAPACITOR HEALTH

(71) Applicant: Micron Technology, Inc., Boise, ID (US)

(72) Inventors: Vehid Suljic, Meridian, ID (US); Matthew D. Rowley, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 212 days.

(21) Appl. No.: 16/524,933

(22) Filed: Jul. 29, 2019

(65) Prior Publication Data

US 2021/0034128 A1 Feb. 4, 2021

(51) Int. Cl.
| | |
|---|---|
| *G06F 1/28* | (2006.01) |
| *G11C 5/14* | (2006.01) |
| *G06F 1/30* | (2006.01) |
| *G06F 3/06* | (2006.01) |
| *H02J 7/34* | (2006.01) |

(52) U.S. Cl.
CPC .................. *G06F 1/28* (2013.01); *G06F 1/30* (2013.01); *G06F 3/0634* (2013.01); *G11C 5/141* (2013.01); *H02J 7/345* (2013.01)

(58) Field of Classification Search
None
See application file for complete search history.

(56) References Cited

U.S. PATENT DOCUMENTS

| | | | |
|---|---|---|---|
| 5,023,556 A | * | 6/1991 | Miller .................. F42C 11/00 102/220 |
| 5,517,634 A | | 5/1996 | Ehrlich |
| 5,579,257 A | | 11/1996 | Tai |

(Continued)

FOREIGN PATENT DOCUMENTS

| | | |
|---|---|---|
| WO | 2013192167 | 12/2013 |
| WO | WO-2021021569 A1 | 2/2021 |
| WO | WO-2021021570 A1 | 2/2021 |

OTHER PUBLICATIONS

"International Application Serial No. PCT US2020 043296, International Search Report dated Oct. 26, 2020", 3 pgs.

(Continued)

*Primary Examiner* — Danny Chan
(74) *Attorney, Agent, or Firm* — Schwegman Lundberg & Woessner, P.A.

(57) ABSTRACT

Various embodiments described herein use a plurality of capacitor sets (e.g., capacitor banks) in a power backup architecture for an electronic system (e.g., memory sub-system), where each capacitor set can be individually checked against a health condition (e.g., in parallel) to determine their respective health during power-up of an electronic system or during normal operation of the electronic system. In response to determining that at least one capacitor set has failed the health condition (or a certain number of capacitor sets have failed the health condition), the electronic system can perform certain operations prior to primary power loss to the electronic system (e.g., memory sub-system preemptively performs a data backup process to data integrity) and can adjust the operational mode of the electronic system (e.g., memory sub-system switches from read-write mode to read-only mode).

20 Claims, 9 Drawing Sheets

(56) References Cited

U.S. PATENT DOCUMENTS

| | | | | |
|---|---|---|---|---|
| 6,075,378 | A * | 6/2000 | Okamura | H02H 7/16 320/122 |
| 6,348,806 | B1 * | 2/2002 | Okandan | G01R 31/2621 324/750.3 |
| 6,580,279 | B1 * | 6/2003 | Baumgartner | G01R 31/006 324/678 |
| 7,953,709 | B2 | 5/2011 | Akidau et al. | |
| 10,126,806 | B2 | 11/2018 | Chiasson et al. | |
| 11,218,019 | B2 | 1/2022 | Suljic et al. | |
| 2009/0226007 | A1 | 9/2009 | Nagashima | |
| 2009/0248756 | A1 * | 10/2009 | Akidau | G06F 11/0727 |
| 2010/0052625 | A1 | 3/2010 | Cagno et al. | |
| 2010/0202240 | A1 | 8/2010 | Moshayedi et al. | |
| 2011/0185211 | A1 * | 7/2011 | Chiasson | G06F 1/3287 713/340 |
| 2011/0215654 | A1 * | 9/2011 | Kumar | H02M 3/06 307/109 |
| 2011/0291984 | A1 * | 12/2011 | Chang | G06F 3/0446 345/174 |
| 2013/0057294 | A1 | 3/2013 | Mizoguchi et al. | |
| 2014/0029346 | A1 | 1/2014 | Tanzawa et al. | |
| 2014/0266416 | A1 | 9/2014 | Dally et al. | |
| 2015/0268709 | A1 * | 9/2015 | Morning-Smith | G01R 31/64 307/23 |
| 2015/0268873 | A1 * | 9/2015 | Gibbons | G06F 3/0616 711/102 |
| 2015/0318027 | A1 | 11/2015 | Ellis et al. | |
| 2016/0274637 | A1 | 9/2016 | Kang | |
| 2018/0059761 | A1 * | 3/2018 | An | H02J 1/10 |
| 2018/0102157 | A1 | 4/2018 | Bedeschi et al. | |
| 2018/0113499 | A1 | 4/2018 | Fernandes | |
| 2018/0364776 | A1 | 12/2018 | Kao et al. | |
| 2019/0121560 | A1 | 4/2019 | Keeth et al. | |
| 2019/0377644 | A1 * | 12/2019 | Kulkarni | G06F 11/1435 |
| 2020/0091739 | A1 * | 3/2020 | Wagoner | F03D 7/0264 |
| 2021/0036540 | A1 | 2/2021 | Suljic et al. | |
| 2021/0089385 | A1 | 3/2021 | Basuta et al. | |

OTHER PUBLICATIONS

"International Application Serial No. PCT US2020 043296, Written Opinion dated Oct. 26, 2020", 5 pgs.

"International Application Serial No. PCT US2020 043292, International Search Report dated Oct. 30, 2020", 3 pgs.

"International Application Serial No. PCT US2020 043292, Written Opinion dated Oct. 30, 2020", 8 pgs.

"International Application Serial No. PCT/US2020/043292, International Preliminary Report on Patentability dated Feb. 10, 2022", 10 pgs.

"International Application Serial No. PCT/US2020/043296, International Preliminary Report on Patentability dated Feb. 10, 2022", 7 pgs.

* cited by examiner

POWER BACKUP ARCHITECTURE TO MANAGE CAPACITOR HEALTH

TECHNICAL FIELD

Embodiments of the disclosure relate generally to power backup and more specifically, relate to power backup architecture that manages health of a capacitor of a backup power source used by an electronic system, such as a memory sub-system.

BACKGROUND

A memory sub-system can be a storage device, a memory module, or a hybrid of a storage device and memory module. The memory sub-system can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
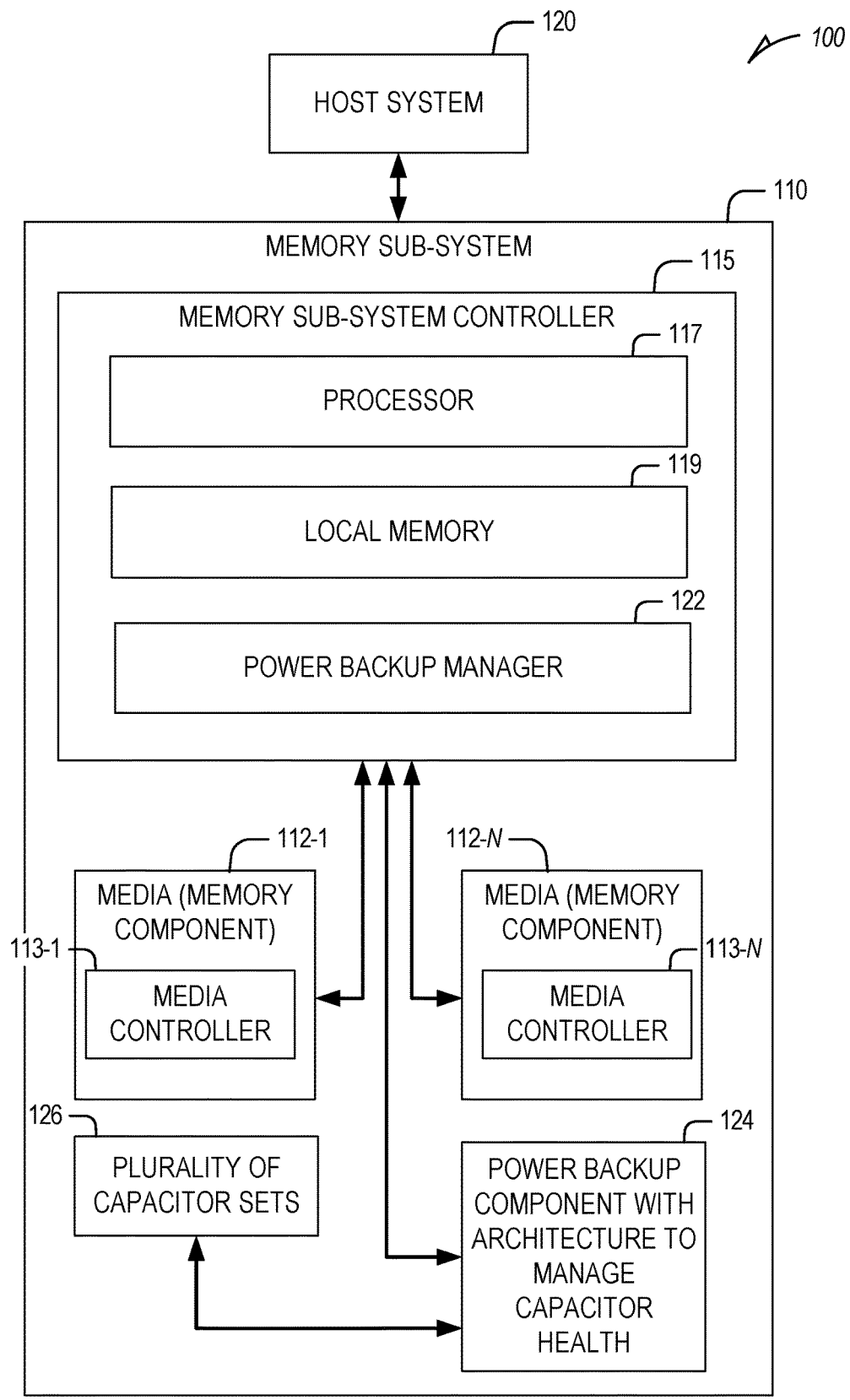
FIG. 1 is a block diagram illustrating an example computing environment including a memory sub-system, in accordance with some embodiments of the present disclosure.

Aspects of the present disclosure are directed to a power backup architecture capable of managing health of a capacitor (e.g., manage a capacitor bank that fails a health check) that forms part of a backup power source, which may be used by or part of a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory components. The host system can provide data (e.g., via write requests) to be stored at the memory sub-system and can request data to be retrieved (e.g., via read requests) from the memory sub-system.

A memory sub-system can include multiple memory components that can store data from the host system. The memory sub-system can further include a memory sub-system controller that can communicate with each of the memory components to perform operations such as reading data, writing data, or erasing data at the memory components in response to requests received from the host system. Any one or more of the memory components of the memory sub-system may include a media controller to manage memory cells of the memory component, communicate with the memory sub-system controller, and execute memory requests (e.g., read or write) received from the memory sub-system controller.

Electronic systems often use a power backup architecture that comprises a grouping of capacitors (e.g., high-voltage capacitors), such as a capacitor bank that includes two or more capacitors. For example, a memory component or a memory sub-system can use such a power backup architecture to ensure data integrity (e.g., data write commands sent to the memory sub-system by a host system are performed) when the memory component/memory sub-system loses power from its primary power source. The power backup architecture can ensure that data in-flight or stored on non-persistent memory is stored to persistent memory of the memory component/memory sub-system in the event primary power failure/loss. Traditionally, for a memory sub-system that uses the aforementioned power backup architecture, if the grouping of one or more capacitors fails a health check, the memory sub-system can be prevented from booting up (e.g. during a boot-up process) or, during normal operation, the memory sub-system can initiate a shutdown process (e.g., because data integrity can no longer be ensured in the event of a primary power failure/loss).

Aspects of the present disclosure address the above and other deficiencies by using a multiple of capacitor sets (e.g., capacitor banks) in a power backup architecture for an electronic system (e.g., memory sub-system), where each capacitor set can be individually checked (e.g., in parallel) against a health condition to determine their respective health during power-up of an electronic system or during normal operation of the electronic system. In response to determining that at least one capacitor set has failed the health condition (or a certain number of capacitor sets have failed the health condition), the electronic system can perform certain operations prior to primary power loss to the electronic system (e.g., memory sub-system preemptively performs a data backup process to data integrity) and can adjust the operational mode of the electronic system (e.g., memory sub-system switches from read-write mode to read-only mode).

A capacitor set can refer to a grouping of one or more capacitors. For instance, a single capacitor set can comprise a capacitor bank. For some embodiments, the capacitor set comprises two or more capacitors of a similar capacitance rating, where the two or more capacitors are arranged in series, in parallel, or some combination thereof. Each capacitor can comprise a high-voltage capacitor suitable for providing backup power to an electronic system.

Though various embodiments are described herein with respect to a memory component or a memory sub-system, some embodiments can be applied to any type of electronic system that uses or relies on a power backup architecture.

The number of capacitors per each capacitor set can depend on design of the power backup architecture or the power needs of the electronic system (e.g., during a primary power failure/loss to the electronic system. A health condition for a given capacitor set can be defined such that the health condition can determine, for example, whether the given capacitor set is experiencing failure (e.g., the given capacitor set is shorted) or is experiencing health that is unfavorable for power backup purposes (e.g., the given capacitor set is unable to hold an acceptable charge). Depending on the embodiment, determining whether a given capacitor set satisfies a health condition can comprise performing a test process that charges on the given capacitor set (e.g., loads a certain charge level on the capacitor set) and then measures how fast the given capacitor set discharges (e.g., fast or steep discharge rate can indicate that the given capacitor set is unhealthy or unreliable for power backup purposes). Where this determination is performed repeatedly (e.g., periodically), the results of the test process can be stored for future reference/comparison, such as to determine whether the rate at which the discharge rate is changing over time (with repeated tests) indicates imminent failure of the given capacitor set.

Some embodiments described herein provide for a system that comprises a primary power interface, a plurality of capacitor sets (hereafter, also referred to as a multiple of capacitor sets), and a processing device that performs one or more with respect to at least the multiple of capacitors. For some embodiments, the system is a memory sub-system that further comprises at least one memory component, and the processing device is either part of a memory sub-system controller coupled to the at least one memory component, or a power backup controller operatively coupled to the multiple of capacitor sets and the memory sub-system controller.

According to various embodiments, at power-up of a memory sub-system, a primary power interface receives power from a power source external to the memory sub-system. In particular, a power backup controller can receive the power via the primary power interface and provide the received power to a memory sub-system controller, a power management component (e.g., power management integrated circuit), or both, thereby causing them to power up. Initially, at power up the memory sub-system controller can cause the memory sub-system to power up in read-only mode, and switches from real-only mode to read-write mode upon a signal from the power backup controller, where the signal indicates it is safe for the memory sub-system to enter read-write mode. Prior to switching from read-only mode to read-write mode, the memory sub-system can be considered to be in power-up mode. After the memory sub-system switches from read-only mode to read-write mode, the memory sub-system can be considered to be in normal operation mode. The power backup controller can transmit the signal to the memory sub-system (that it is safe to switch from read-only mode to read-write mode), for example, the power backup controller can transmit the signal to the memory sub-system controller after, and in response to, the power backup controller determining that each of the capacitor sets of multiple of capacitor sets satisfies a health condition (e.g., indicating that is healthy and reliable to serve as a power backup source). Alternatively, the power backup controller can transmit the signal to the memory sub-system controller after (and in response to) the power backup controller determining that the number of capacitor sets that fail to satisfy the health condition does not transgress a threshold number of capacitor sets (e.g., less than a threshold number of capacitor sets failed to satisfy the health condition). The threshold number can depend on the design of power backup architecture, such as the number of extra or redundant capacitor sets in the multiple of capacitor sets in view of a power need of an electronic system (e.g., the memory sub-system). Depending on the embodiment, the threshold number can be one defined (e.g., statically defined) by a manufacturer of the electronic system, or can be defined by a user via a host system that is in communication with the electronic system. Additionally, in response to the power backup controller determining that each of the capacitor sets of multiple of capacitor sets satisfies a health condition (or that a number of capacitor sets failing to satisfy the health condition does not transgress a threshold number), the power backup controller can cause those capacitor sets in the multiple of capacitor sets that satisfy the health condition to charge (e.g., load a certain level of charge that satisfies a charge condition). After this charging is complete, the power backup controller can transmit the signal (that it is safe to switch from read-only mode to read-write mode) to the memory sub-system controller. The memory sub-system controller can respond to the signal by switching from the read-only mode to read-write mode, and may also perform one or more additional operations associated with entering into normal operation mode (e.g., clearing write caches).

Alternatively, during power-up, if the power backup controller determines that at least one capacitor set of the multiple of capacitor sets has failed to satisfy the health condition (or that a number of capacitor sets failing to satisfy the health condition transgresses a threshold number), the power backup controller can refrain from signaling the memory sub-system controller that it is safe to enter read-write mode, thereby resulting in the memory sub-system remaining read-only mode. Additionally, in response to the power backup controller determining at least one capacitor set of the multiple of capacitor sets has failed (or that a number of capacitor sets failing to satisfy the health condition transgresses a threshold number), one or more capacitor sets in the multiple of capacitor sets that satisfy the health condition can be charged (e.g., load a certain level of charge), while any remaining capacitor set can be isolated and remain un-charged.

An embodiment described herein can use a threshold number with respect to failed capacitor sets where the multiple of capacitor sets of the embodiment is designed to include one or more extra or redundant capacitor sets (e.g., in view of the power backup needs of the memory sub-system). The use of extra or redundant capacitor sets can permit a memory sub-system to safely switch from read-only mode to read-write mode (e.g., normal operation mode) during power-up, even when a certain number of capacitor sets does not transgress a threshold number (e.g., certain number less than the threshold number) fails to satisfy the health condition. During normal operation mode, use of extra or redundant capacitor sets can permit a memory sub-system to continue to operate in read-write mode as long as less than the threshold number of failed capacitor sets is detected.

Subsequently (e.g., after the memory sub-system has entered normal operation mode), the power backup controller can perform a health check on individual capacitor sets (e.g., each individual capacitor set) of a multiple of capacitor sets. As described herein, a health check can be performed on individual capacitor sets periodically (e.g., every 30 minutes), and multiple health checks can be performed on individual capacitor sets in parallel. As described herein, performing a health check on an individual capacitor set can comprise determining whether the individual capacitor set satisfies a health condition, where the health condition can be defined to determine whether a capacitor set is unhealthy (e.g., shorted or health unfavorable to serve as a backup power source). If the power backup controller determines that at least one capacitor set, the power backup controller can respond one or more different ways.

While the memory sub-system is in read-write mode (e.g., in normal operation mode), if the power backup controller determines that at least one of the capacitor sets of the multiple of capacitor sets fails to satisfy a health condition (or if the power backup controller determines that more than a threshold number of capacitor sets fail to satisfy the health condition), the power backup controller can transmit a signal to the memory sub-system controller indicating failure of the health condition by at least one capacitor set. Depending on the embodiment, the transmitted signal can indicate how many capacitor sets have failed to satisfy the health condition and can identify which capacitor sets have failed to satisfy the health condition (or which ones have satisfied the health condition). In response to the signal, the memory sub-system controller can initiate (and can perform at least in part) a data backup process on the memory sub-system. Depending on the embodiment, the data backup process can comprise causing any data still pending persistent storage on a memory component of the memory sub-system to be persistently stored on the memory component. Such data can include, for example, data "in flight" to the memory sub-system from a host system, which may be stored on a cache of the memory sub-system but has yet to be committed to a memory component of the memory sub-system. In response to determining that a particular capacitor set in the multiple of capacitor sets has filed to satisfy a health condition, the power backup controller can isolate that particular capacitor set from being charged or used by the power backup controller when the memory sub-system suffers loss or failure of primary power (via the primary power interface).

In response to a signal (from the power backup controller) indicating failure of the health condition by at least one capacitor set, the memory sub-system controller can cause the memory sub-system to switch from read-write mode to read-only mode. Depending on the embodiment, this switch can be performed after a data backup process (initiated by the memory sub-system has completed. The signal from the power backup controller can serve as an indication to the memory sub-system controller that the multiple of capacitor sets cannot currently be relied upon as a backup power source to the memory sub-system in the event of a power failure and, as such, the multiple of capacitor sets cannot ensure data integrity in the event of a power failure. By switching the memory sub-system to read-only mode after the data backup process is completed, a host system can be informed that the memory sub-system is no longer accepting data write from the host system, thereby avoiding any subsequent data integrity issues (e.g., data from the host failing to get persistently stored on a memory component of the memory sub-system). Additionally, by switching the memory sub-system from read-write mode to read-only mode, while the memory sub-system is being powered by an external power source, a host system can read data already stored on the memory sub-system and do so despite the multiple of capacitor sets being unreliable/unavailable as a backup power source. This can also obviate the need for the memory sub-system to be first repaired or returned to a memory sub-system manufacturer for data recovery in the event the multiple of capacitor sets becomes unreliable/unavailable.

The memory sub-system controller can respond to a signal (from the power backup controller) indicating failure of the health condition by at least one capacitor set by permitting the memory sub-system to continue operation in read-write mode (e.g., in normal operation mode). For some embodiments, the memory sub-system permits the memory sub-system to continue operation in read-write mode (despite the signal from the power backup controller) as long as the number of capacitor sets that failed the health condition does not transgress a threshold number, as described herein. Additionally, for some embodiments, the memory sub-system permits the memory sub-system to continue operation in read-write mode (despite the signal from the power backup controller) for a set amount of time or for a set number of data transaction (e.g., read or write transactions).

While the memory sub-system is in read-write mode (e.g., in normal operation mode), if the power backup controller detects a power failure (e.g., the primary power interface stops receiving power from a source external to the memory sub-system), the power backup controller can switch the memory sub-system from being powered by the primary power interface to being powered by the multiple of capacitor sets. In particular, this can involve the power backup controller can switch the memory sub-system controller from being powered by the primary power interface to being powered by the multiple of capacitor sets. In doing so, the memory sub-system can be isolated from the power rail and a hardware power connector of the memory sub-system that couple to an external power source (e.g., provided by a host system). At this point, the memory sub-system can be considered to be in power failure mode. Additionally, the power backup controller can transmit a signal to the memory sub-system controller that indicates to the memory sub-system that a power failure event has occurred.

While being powered by the multiple of capacitor sets (e.g., in power failure mode), the memory sub-system can respond to a signal (from the power backup controller) indicating that a power failure event has occurred by initiating (and possibly performing at least part of) a data backup process on the memory sub-system. As described herein, the data backup process can comprise causing any data still pending persistent storage on a memory component of the memory sub-system (e.g., data "in flight" from a host system to the memory sub-system) to be persistently stored on the memory component.

By use of various embodiments described herein, an electronic system (such as a memory sub-system as described herein) can provide limited operation even when one or more capacitor sets that are part of a backup power source fail a health check (e.g., capacitor sets are shorted or are exhibit deteriorating health). For instance a memory sub-system suffering from one or more capacitor sets in a backup power source can continue to operate in read-only mode (e.g., to permit a customer to recover stored data without repair or return to a manufacturer), or operate in read-write mode (e.g., if the backup power source comprises one or more extra/redundant capacitor sets and the number of failing capacitor sets does not transgress a threshold number). Additionally, with respect to a memory sub-system, various embodiments can assist in maintaining data integrity on the memory sub-system by determining (prior to the memory sub-system losing primary power) whether at least one capacitor set of a backup power source fails a health condition, or a certain number of capacitor sets of the backup power source fail the health condition, and responding to the determination by initiating a data backup process and switching to read-only mode on the memory sub-system.

Disclosed herein are some examples of systems that include or use a power backup architecture comprising a multiple of capacitor sets and capable of managing one or more capacitor sets that fail a health condition, as described herein.

FIG. 1 illustrates an example computing environment 100, including a memory sub-system 110, in accordance with some examples of the present disclosure. The memory sub-system 110 can include media, such as memory components 112A to 112N. The memory components 112A to 112N can be volatile memory devices, non-volatile memory devices, or a combination of such. In some embodiments, the memory sub-system 110 is a storage system. A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, embedded computer (e.g., one included in a vehicle, industrial equipment, or a networked commercial device), or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a Fibre Channel interface, a Serial Attached SCSI (SAS) interface, etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

Though not illustrated, the memory sub-system 110 can include a physical power interface that permits the memory sub-system 110 to receive power from an external power source. For some embodiments, the external power source is part of the host system 120, such as a power supply unit of the host system 120.

The memory components 112A to 112N can include any combination of the different types of non-volatile memory components and/or volatile memory components. An example of non-volatile memory components includes a negative-and (NAND)-type flash memory. Each of the memory components 112A to 112N can include one or more arrays of memory cells such as single-level cells (SLCs) or multi-level cells (MLCs) (e.g., TLCs or QLCs). In some embodiments, a particular memory component 112 can include both an SLC portion and an MLC portion of memory cells. Each of the memory cells can store one or more bits of data (e.g., data blocks) used by the host system 120. Although non-volatile memory components such as NAND-type flash memory are described, the memory components 112A to 112N can be based on any other type of memory, such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magnetoresistive random access memory (MRAM), negative-or (NOR) flash memory, electrically erasable programmable read-only memory (EEPROM), and a cross-point array of non-volatile memory cells. A cross-point array of non-volatile memory cells can perform bit storage based on a change of bulk resistance, in conjunction with a stackable cross-gridded data access array. Additionally, in contrast to many flash-based memories, cross-point non-volatile memory can perform a write-in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component 112 used to store data.

The memory sub-system controller 115 can communicate with the memory components 112A to 112N to perform operations such as reading data, writing data, or erasing data at the memory components 112A to 112N and other such operations. The memory sub-system controller 115 can include hardware such as one or more integrated circuits and/or discrete components, a buffer memory, or a combination thereof. The memory sub-system controller 115 can be a microcontroller, special-purpose logic circuitry (e.g., a field programmable gate array (FPGA), an application specific integrated circuit (ASIC), etc.), or another suitable processor. The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, and so forth. The local memory 119 can also include read-only memory (ROM) for storing microcode. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system 110).

In general, the memory sub-system controller 115 can receive commands or operations from the host system 120 and can convert the commands or operations into instructions or appropriate commands to achieve the desired access to the memory components 112A to 112N. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The memory sub-system controller 115 can further include host interface circuitry to communicate with the host system 120 via the physical host interface. The host interface circuitry can convert the commands received from the host system 120 into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory components 112A to 112N.

Any one of the memory components 112A to 112N can include a media controller (e.g., media controller 113A and media controller 113N) to manage the memory cells of the memory component 112, to communicate with the memory sub-system controller 115, and to execute memory requests (e.g., read or write) received from the memory sub-system controller 115.

As shown, the memory sub-system 115 further comprises a power backup manager 122, and the memory sub-system 110 further comprises a power backup component 124 with architecture to manage capacitor health, and a plurality of capacitor sets 126 (hereafter, capacitor sets 126). For some embodiments, the plurality of capacitor sets 126 provide or assist in providing backup power to the memory sub-system 110 in the event of primary power loss to the memory sub-system 110. The power backup manager 122, the power backup component 124, or a combination of both can implement some embodiments with respect to the memory sub-system 110.

For some embodiments, at power-up of the memory sub-system 110, the power backup component 124 determines whether it is receiving primary power from the host system 120 (e.g., via a primary power interface of the memory sub-system 110). In response to determining that primary power is being received, the power backup component 124 can determine whether at least one capacitor set of the capacitor sets 126 of the memory sub-system 110 fails to satisfy a health condition (or determine whether a number of capacitor sets failing to satisfy the health condition transgresses a threshold number of capacitor sets). In response to the power backup component 124 determining that at least one capacitor set fails to satisfy the health condition (or that the number of capacitor sets failing to satisfy the health condition transgresses the threshold number), the power backup component 124 can cause the memory sub-system controller 115 to perform a data backup process (as described herein) and (e.g., subsequently) can cause the memory sub-system 110 (e.g., via a signal to the memory sub-system controller 115) to switch to read-only mode (or remain in read-only mode if the memory sub-system 110 powers-up in read-only mode by default). Alternatively, in response to the power backup component 124 determining that all capacitor set satisfy the health condition (or that the number of capacitor sets failing to satisfy the health condition does not transgress the threshold number), the power backup component 124 can cause the memory sub-system 110 (e.g., via a signal to the memory sub-system controller 115) to switch to read-write mode, and can cause those capacitor sets in the capacitor sets 126 that pass the health condition to charge (e.g., to a desired charge level). Those capacitor sets in the capacitor sets 126 that do not pass the health condition can be isolated and prevented from charging.

After the memory sub-system 110 enters read-write mode, the power backup component 124 can periodically determine whether individual capacitor sets of the capacitor sets 126 satisfy the health condition, and, in parallel, can periodically determine whether the memory sub-system 110 stop receiving primary power (e.g., from the host system 120) via the primary power interface of the memory sub-system 110. During the periodic determination with respect to the capacitor sets 126, if the power backup component 124 determines that at least one capacitor set fails to satisfy the health condition (or that the number of capacitor sets failing to satisfy the health condition transgresses the threshold the number), the power backup component 124 can cause the memory sub-system controller 115 to perform a data backup process (as described herein). The power backup component 124 can (e.g., subsequently) can cause the memory sub-system 110 (e.g., via a signal to the memory sub-system controller 115) to switch from read-write mode to read-only mode.

During the periodic determination with respect to loss of primary power to the memory sub-system 110, if the power backup component 124 determines that the memory sub-system 110 stops receiving primary power (e.g., from the host system 120), the power backup component 124 can cause power to the memory sub-system 110 (e.g., the memory sub-system controller 115 or one of the memory components 112) switching from a primary power source (via the primary power interface) to the capacitor sets 126. Additionally, the power backup component 124 can further respond by causing the memory sub-system controller 115 to perform a data backup process as described herein. For instance, the data backup process can cause all data, in-flight from the host system (e.g., 120) to the memory sub-system (e.g., 110) not yet stored to persistent storage of the memory sub-system, to be stored (e.g., on one or more the memory components 112-1 to 112-N.

The power backup manager 122 can implement one or more aspects of some embodiments with respect to the memory sub-system controller 115. For instance, during power-up of the memory sub-system 110, the power backup manager 122 can cause the memory sub-system 110 to switch to switch from read-only mode to read-write mode in response to a signal from the power backup component 124. As described herein, that signal can indicate that all of the capacitor sets in the capacitor sets 126 satisfy the health condition or indicate that the number of capacitor sets that fail to satisfy the heal condition does not transgress a threshold number. Additionally, the power backup manager 122 can cause the memory sub-system controller 115 to perform a data back process on the memory sub-system 110 in response to a corresponding signal from the power backup component 124.

Figure 2:
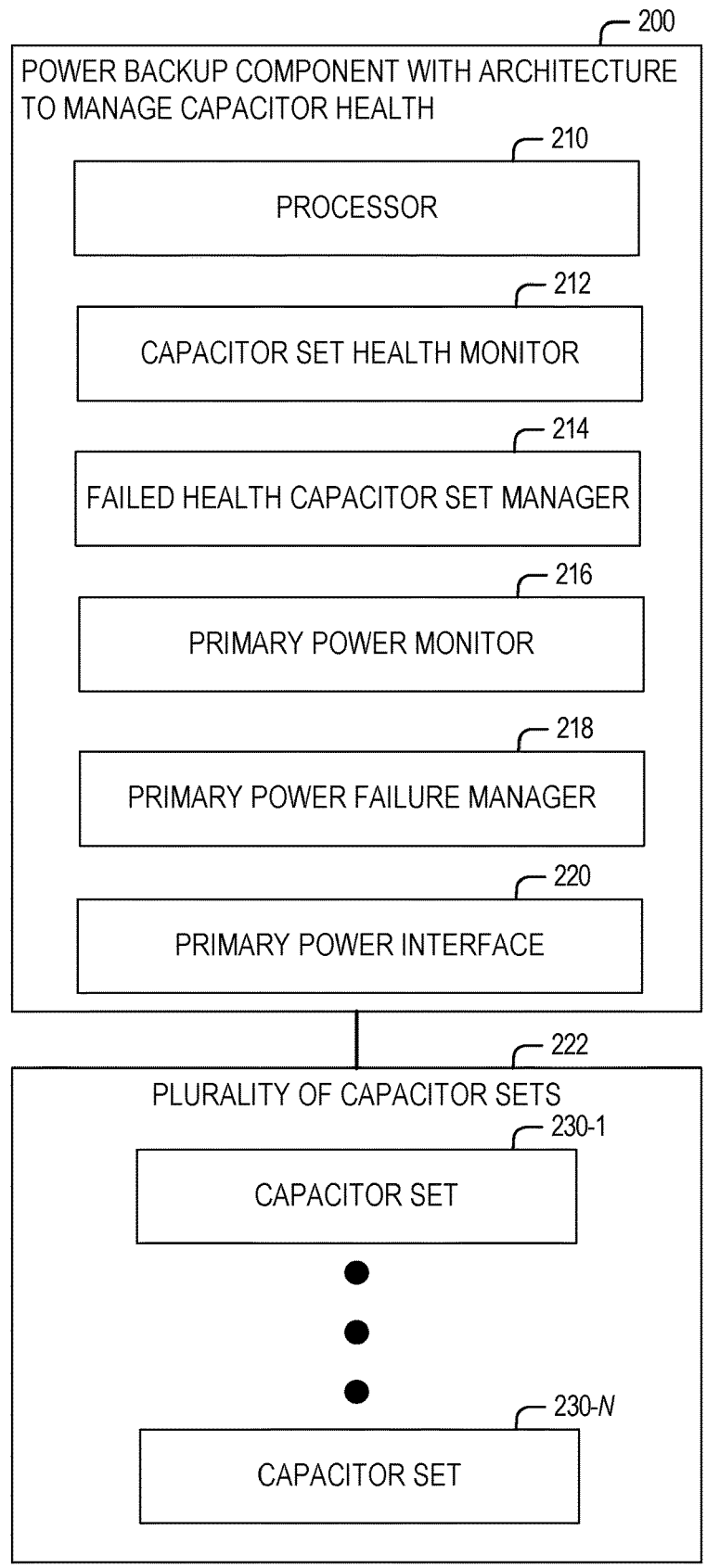
FIG. 2 is a block diagram of an example power backup component with architecture to manage capacitor health, in accordance with some embodiments of the present disclosure.

FIG. 2 is a block diagram of an example power backup component 200 with architecture to manage capacitor health, in accordance with some embodiments of the present disclosure. As shown, the power backup component 200 comprises a processor 210, a capacitor set health monitor 212, a failed health capacitor set manager 214, a primary power monitor 216, a primary power failure manager 218, and a primary power interface 220. As also shown, the power backup component 200 is operatively coupled to a plurality of capacitor sets 222 (hereafter, the capacitor sets 222), which comprises capacitor sets 230-1 to 230-N. For some embodiments, the power backup component 200 serves an electronic system, such as a memory sub-system (e.g., 110). Depending on the embodiment, the power backup controller 200 can be part of or separate (e.g., external) from the electronic system. Additionally, the capacitor sets 222 used by the power backup component 200 can be part of or separate (e.g., external) from the electronic system.

According to some embodiments, the processor 210 comprises a processing device that performs at least one of the operations described herein with respect to some embodiments. Depending on the embodiment, the processor 210 can perform one or more operations with respect to the capacitor sets 222 (e.g., charge, discharge, test individual capacitor sets), and can control one or more operations of the power backup component 200 (e.g., switching power provided to an electronic system, by the power backup component 200, from power received via the primary power interface 220 to power from the capacitor sets 222).

For some embodiments, the capacitor set health monitor 212 determines (e.g., periodically) whether an individual capacitor set 230-N, in the capacitor sets 222, satisfies a health condition and, in doing so, can check the health of the individual capacitor set 230-N. As described herein, the capacitor set health monitor 212 can perform this determination by a performing a test process on the individual capacitor set 230-N, where the test process comprises, for example, loading a charge on the individual capacitor set 230-N (e.g., charge to a certain charge level), and then measuring how fast the individual capacitor set 230-N discharges (e.g., fast or steep discharge rate can indicate that the given capacitor set is unhealthy or unreliable for power backup purposes). Where capacitor set health monitor 212 performs the determination (e.g., test process) repeatedly (e.g., periodically) for individual capacitor sets of the capacitor sets 222, the results of the determination can be stored for future reference/comparison, thereby facilitating determination of whether the rate at which the discharge rate is changing over time (with repeated tests) indicates imminent failure of individual capacitor sets in the capacitor sets 222.

The failed health capacitor set manager 214 responds to one or more determinations made by the capacitor set health monitor 212 with respect to individual capacitor sets in the capacitor sets 222. For instance, depending on the embodiment, the failed health capacitor set manager 214 can respond to a determination (by the capacitor set health monitor 212) that at least one capacitor set of the capacitor sets 222 fails the health condition, or can respond to a determination (by the capacitor set health monitor 212) that a number of capacitor sets of the capacitor sets 222 that fail the health condition transgresses of a threshold number (e.g., respond if the number of capacitor sets failing to satisfy the health condition surpasses the threshold number).

With respect to responses, the failed health capacitor set manager 214 can cause a memory sub-system (e.g., 110) to perform a data backup process (as described herein) in response to the capacitor set health monitor 212 determining that at least one capacitor set of the capacitor sets 222 fails to satisfy the health condition. Additionally, the failed health capacitor set manager 214 can cause a memory sub-system (e.g., 110) to switch to read-only mode (e.g., from read-write mode) in response to the capacitor set health monitor 212 determining that at least one capacitor set of the capacitor sets 222 fails to satisfy the health condition.

Alternatively, the failed health capacitor set manager 214 can cause a memory sub-system (e.g., 110) to perform a data backup process (as described herein) in response to the capacitor set health monitor 212 determining that a number of capacitor sets of the capacitor sets 222 that fail the health condition transgresses of a threshold number. Additionally, the failed health capacitor set manager 214 can cause a memory sub-system (e.g., 110) to switch to read-only mode (e.g., from read-write mode) in response to the capacitor set health monitor 212 determining that a number of capacitor sets of the capacitor sets 222 that fail the health condition transgresses of a threshold number.

The primary power monitor 216 determines (e.g., periodically) whether the power backup component 200 starts or stops receiving power from an external power source (e.g., the host system 120) via the primary power interface 220. For instance, as described herein, the power received via the primary power interface 220 can comprise power received by an electronic system (e.g., the memory sub-system 110), such as from a host system (e.g., 120).

The primary power failure manager 218 responds to the determination by the primary power monitor 216. For some embodiments, the primary power failure manager 218 responds to a determination, by the primary power monitor 216 that the via the primary power interface 220 has stopped receiving primary power, by causing the power provided to the memory sub-system (e.g., 110) to switch from power from the primary power interface 220 to power provided by the capacitor sets 222.

The primary power interface 220 receives power from a power source that external to the power backup component 200. For example, where the power backup components 200 is part of a memory sub-system (e.g., 110), the primary power interface 220 can receive power via a physical interface of the memory sub-system. For instance, power received by the physical interface of the memory sub-system can be provided by a host system (e.g., 120), such as by a power supply unit of the host system. Through the primary power interface 220, the power backup component 200 can monitor for primary power loss, which can result in the power backup component 200 providing an electronic system (e.g., memory sub-system) from the capacitor sets 222 instead of the power received from the primary power interface 220.

For some embodiments, each capacitor set 230-N can comprise one or more capacitors, and each of those capacitors can comprise a high-voltage capacitor suitable for provide backup power to an electronic system. As described herein, a given capacitor set 230-N can comprise two or more capacitors arranged in parallel, in series, or some combination thereof.

Figure 3:
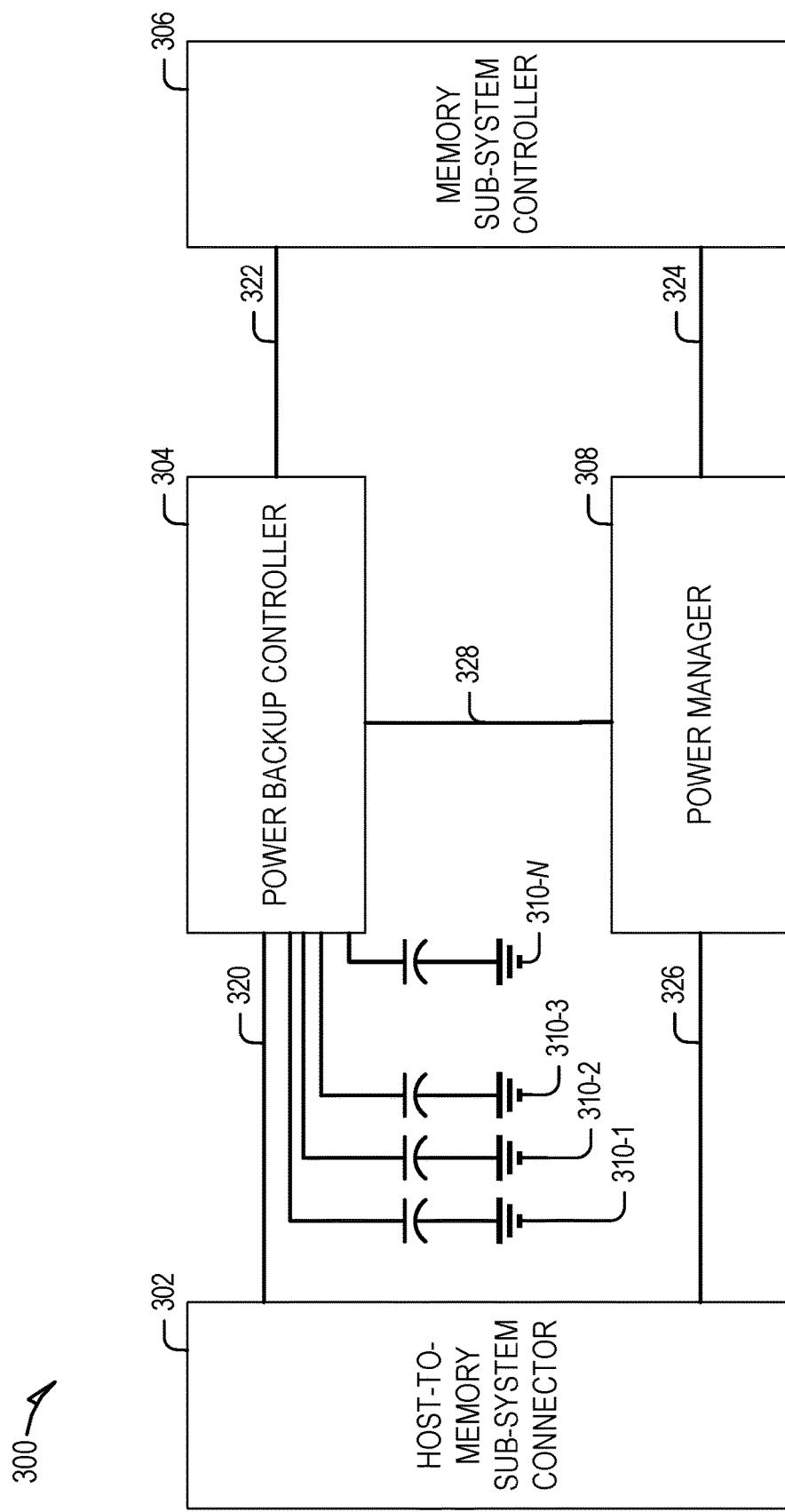
FIG. 3 is a diagram of an example power backup architecture implemented with respect to a memory sub-system, in accordance with some embodiments of the present disclosure.

FIG. 3 is a diagram of an example power backup architecture 300 implemented with respect to a memory sub-system, in accordance with some embodiments of the present disclosure. In particular, the power backup architecture 300 comprises a host-to-memory-sub-system connector 302, a power backup controller 304, a memory sub-system controller 306, a power manager 308, and a plurality of capacitor sets 310-1 to 310-N. For some embodiments, the power backup controller 304 comprises the power backup component 200 described herein with respect to FIG. 2. For some embodiments, the power manager 308 comprises a power management integrated circuit (IC). Additionally, for some embodiments, the memory sub-system controller 306 comprises the memory sub-system controller 115 described above with respect to FIG. 1.

The host-to-memory-sub-system connector 302 can comprise one or more hardware interfaces that permit a memory sub-system to operatively couple to a host system, thereby facilitating data operations between the memory sub-system and the host system. Coupling 320 operatively couples the host-to-memory-sub-system connector 302 to the power backup controller 304, and coupling 326 operatively couples the host-to-memory-sub-system connector 302 to the power manager 308. The coupling 320 can comprise a host power connection, thereby providing the power backup controller 304 with primary power provided to the memory sub-system, by a host system, via the host-to-memory-sub-system connector 302. The coupling 326 can comprise one or more input/output (I/O) connections (e.g., general purpose input output (GPIO), I2C).

As shown, coupling 328 operatively couples the power backup controller 304 and the power manager 308. The coupling 328 can comprise one or more I/O connections (e.g., GPIO, I2C), a power connection that permits the power backup controller 304 to provide power to the power manager 308, and a connection for the power backup controller 304 to signal the power manager 308 that there is a loss of power from the host system.

As illustrated, coupling 322 operatively couples the power backup controller 304 and the memory sub-system controller 306. The coupling 322 can comprise a connection for the power backup controller 304 to signal the memory sub-system controller 306 that the memory sub-system controller 306 can switch to read-write mode (e.g., switch from read-only mode to read-write mode), one or more I/O connections (e.g., GPIO, I2C), and a connection for the power backup controller 304 to signal the memory sub-system controller 306 that there is a loss of power from the host system. Coupling 324 operatively couples the memory sub-system controller 306 and the power manager 308. The coupling 324 can comprise one or more I/O connections (e.g., GPIO, I2C).

As shown, the power backup controller 304 is coupled to the plurality of capacitor sets 310-1 to 310-N, where each capacitor set 310 can be coupled to a separate pin of the power backup controller 304. Through a given pin coupled to a given capacitor set 310, the power backup controller 304 can charge, discharge, or test the given capacitor set 310.

During operation, once power to the memory sub-system via the host-to-memory-sub-system connector 302, the power backup controller 304 can power on the memory sub-system, and can permit the power manager 308 and the memory sub-system controller 306 to power-up (e.g., boot) such that the memory sub-system is in read-only mode. After power-up, the power backup controller 304 can run health checks (e.g., based on a health condition) on each of the capacitor sets 310-1 to 310-N. For some embodiments, if the health checks on each of the capacitor sets 310-1 to 310-N passes (or the number of capacitor sets that fail the health check does not transgress a threshold number), each of the capacitor sets 310-1 to 310-N that passes its health check is charged and a signal can be passed to the memory sub-system controller 306 to indicate when power-up is complete. If one or more of the capacitor sets 310-1 to 310-N fails their respective health check, they are isolated and the remaining of the capacitor sets 310-1 to 310-N are charged and a signal can be passed to the memory sub-system controller 306 that a failure of at least one capacitor set has occurred. For some embodiments, the memory subs-system can remain in read-only mode until the power backup controller 304 signals to the memory sub-system controller 306 that power-up of the power backup controller 304 is complete (e.g., each of the capacitor sets 310 has passed its health check and is charged). In the event of a power loss to the memory sub-system (power via the host-to-memory-sub-system connector 302, the host-to-memory-sub-system connector 302 can be isolated from the drive and the power backup controller 304 can switch power over to the capacitor sets 310-1 to 310-N.

Figure 4:
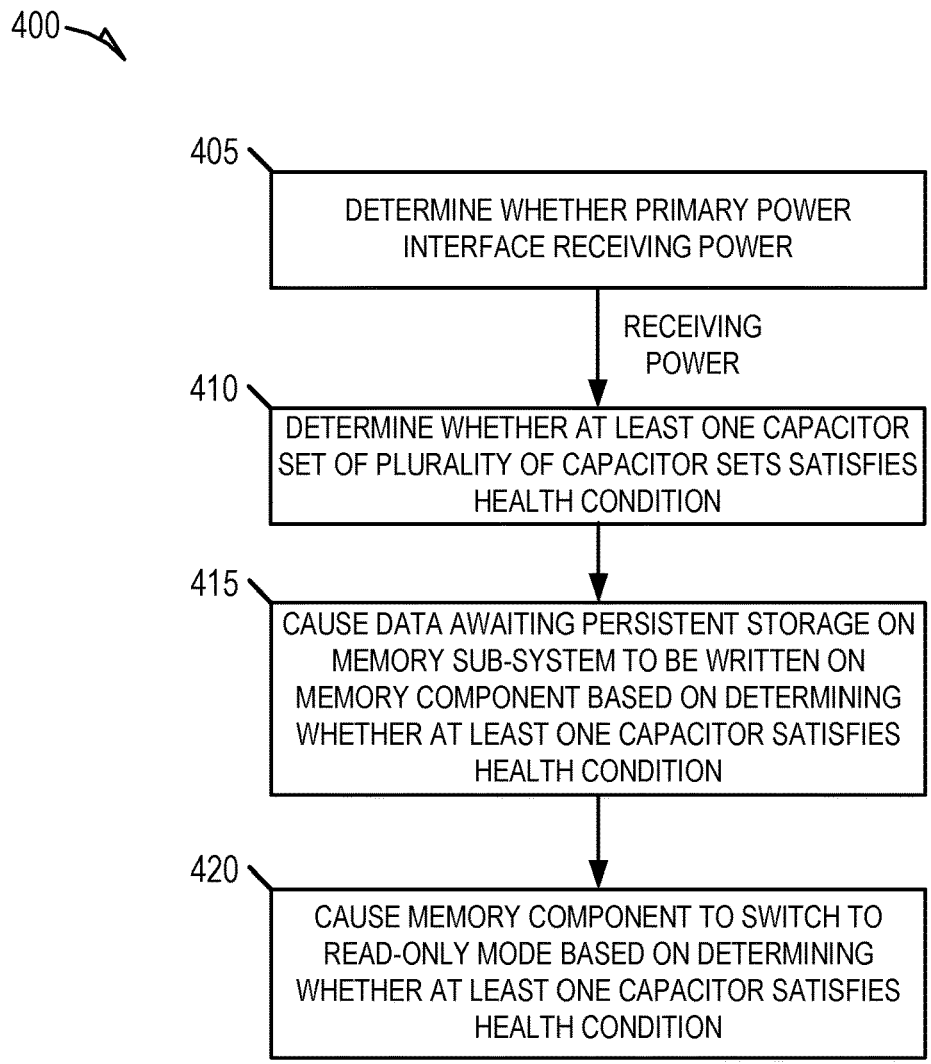
FIGS. 4 and 5 are flow diagrams of example methods for managing capacitor health with respect to a power backup architecture, in accordance with some embodiments of the present disclosure.
Figure 5:
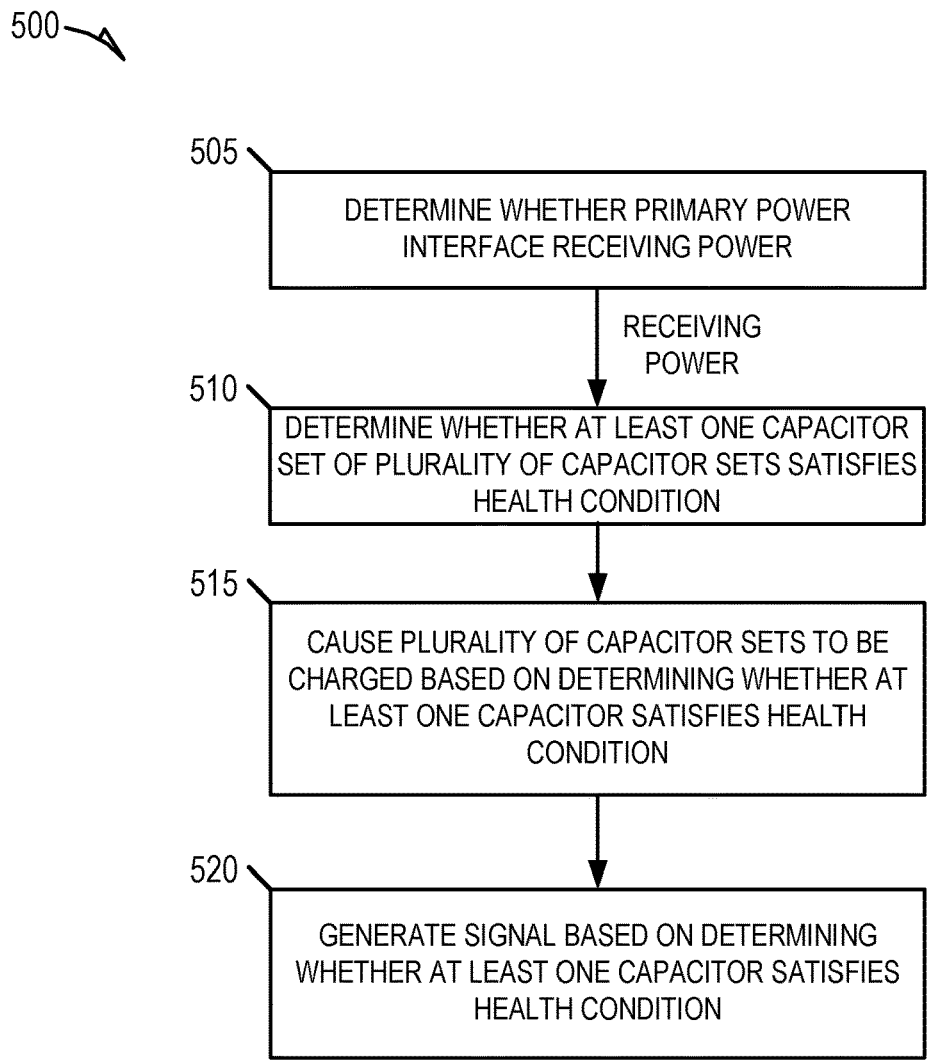

FIGS. 4 and 5 are flow diagrams of example methods for managing capacitor health with respect to a power backup architecture, in accordance with some embodiments of the present disclosure. The methods 400, 500 can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. According to some embodiments, the method 400 is performed by the power backup component 124 of FIG. 1. Additionally or alternatively, for some embodiments, the method 400 is performed, at least in part, by the memory sub-system controller 115 (e.g., the processor of the memory sub-system controller 115) based on the power backup manager 122. Although the processes are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

Referring now to the method 400 of FIG. 4, at operation 405, a processing device (e.g., of the controller 210 or the memory sub-system controller 115) determines whether a primary power interface of a memory sub-system (e.g., 110) is receiving power from a power source external to the memory sub-system (e.g., power supply unit of the host system 120). Depending on the embodiment, operation 405 can be performed during initial power-up of the memory sub-system, thereby confirming that primary power is being received by the memory sub-system. While receiving power via the primary power interface, at operation 410, the processing device determines whether at least one capacitor set, of a plurality of capacitor sets of the memory sub-system, satisfies a health condition. For some embodiments, this determination is performed for each capacitor set of the plurality of capacitor sets.

At operation 415, the processing device causes data that is awaiting persistent storage on the memory sub-system (e.g., data in-flight from the host system to the memory sub-system) to be written to at least one memory component (e.g., 112-1) of the memory sub-system based on the determination performed at operation 410. For instance, in response to determining that at least one capacitor set fails to satisfy the health condition (or in response to a number of capacitor sets failing to satisfy the health condition transgressing a threshold number), the processing device can cause the data to be written to at least one memory component of the memory sub-system.

Subsequently, at operation 420, the processing device causes the memory sub-system (or at least a memory component thereof) to switch to read-only mode based on the determination performed at operation 410. For instance, in response to determining that at least one capacitor set fails to satisfy the health condition (or in response to a number of capacitor sets failing to satisfy the health condition transgressing a threshold number), the processing device can cause the memory sub-system (or at least a memory component thereof) to switch from read-write mode to read-only mode.

Referring now to the method 500 of FIG. 5, at operation 505, a processing device (e.g., of the controller 210 or the memory sub-system controller 115) determines whether a primary power interface of a memory sub-system (e.g., 110) is receiving power from a power source external to the memory sub-system (e.g., power supply unit of the host system 120). Depending on the embodiment, operation 505 can be performed during initial power-up of the memory sub-system, thereby confirming that primary power is being received by the memory sub-system. While receiving power via the primary power interface, at operation 510, the processing device determines whether at least one capacitor set, of a plurality of capacitor sets of the memory sub-system, satisfies a health condition. For some embodiments, this determination is performed for each capacitor set of the plurality of capacitor sets.

At operation 515, the processing device causes a plurality of capacitor sets to be charged based on the determination performed at operation 510. For instance, in response to determining that each capacitor set in the plurality of capacitor sets has satisfied the health condition at operation 510, the processing device can cause all of the plurality of capacitor sets to charge. In response to determining that at least one capacitor set in the plurality of capacitor sets fails to satisfy the health condition at operation 510, the processing device can cause each capacitor set that satisfies the health condition to charge.

Subsequently, at operation 520, the processing device generates a signal (e.g., from the power backup controller 304 to the memory sub-system controller 306) based on the determination performed at operation 510. For instance, where the memory sub-system initially powers-up in read-only mode, in response to determining that at least one capacitor set fails to satisfy the health condition (or in response to a number of capacitor sets failing to satisfy the health condition transgressing a threshold number), the processing device can refrain from generating a signal that causes the memory sub-system (or at least a memory component thereof) to remain in read-only mode. Alternatively, in response to determining that each of the capacitor sets satisfy the health condition (or in response to a number of capacitor sets failing to satisfy the health condition not transgressing a threshold number), the processing device can generate a signal that causes the memory sub-system (or at least a memory component thereof) to switch from read-only mode to read-write mode. This signal can be generated after operation 515 has successfully charged each capacitor set that has satisfied the health condition. Additionally, at operation 520, in response to determining that at least one capacitor set fails to satisfy the health condition (or in response to a number of capacitor sets failing to satisfy the health condition transgressing a threshold number), the process device can generate a signal that causes data that is awaiting persistent storage on the memory sub-system to be written to at least one memory component (e.g., via a data backup process performed on the memory sub-system).

For some embodiments, after a signal generated (at operation 520) by a power backup component indicates to a memory sub-system controller that it is safe to switch to read-write mode, the power backup component can continue to assert the signal while each of capacitor sets satisfies the health condition (or while the number of capacitor sets that fail to satisfy the health condition does not transgress a threshold number). In response to determining that at least one capacitor set fails to satisfy the health condition (or in response to a number of capacitor sets failing to satisfy the health condition transgressing a threshold number), the power backup component can stop asserting the signal to the memory sub-system, which can cause the memory sub-system to perform a data backup process and switch from read-write mode to read-only mode.

Figure 6A:
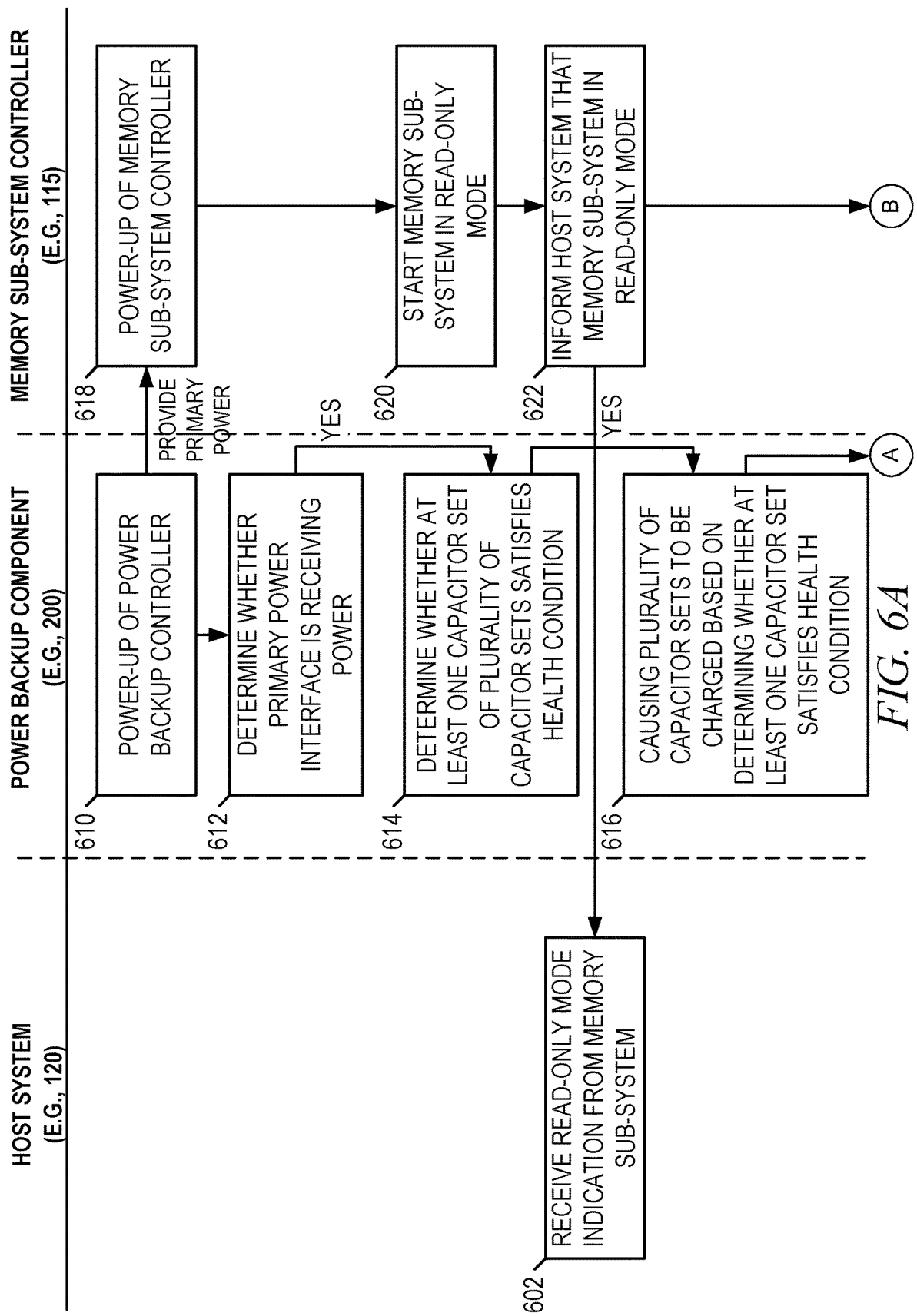
FIGS. 6A through 6C provide an interaction diagram illustrating interactions between components of a computing environment in the context of some embodiments in which a method for managing capacitor health with respect to a power backup architecture is performed.
Figure 6B:
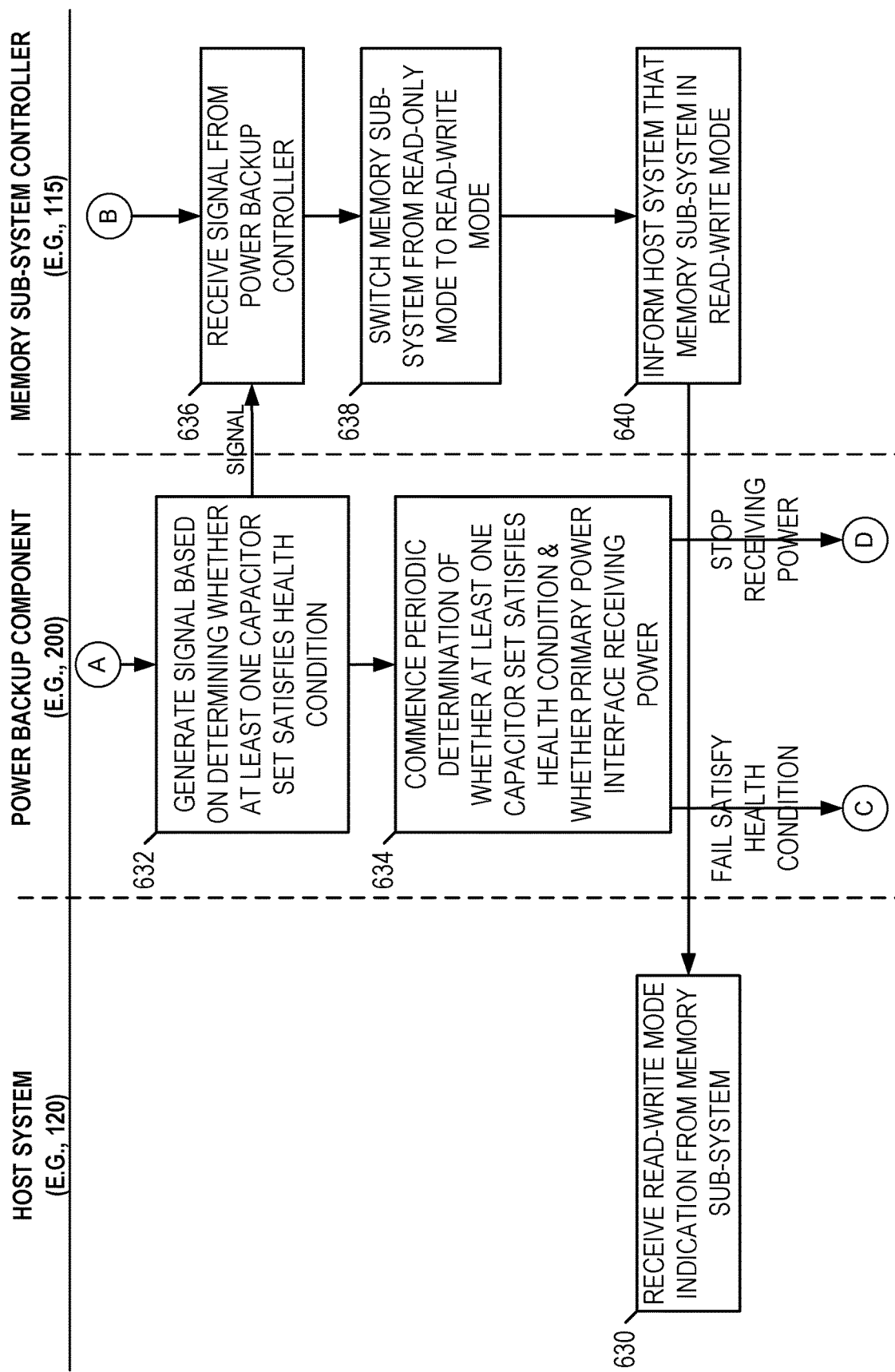
Figure 6C:
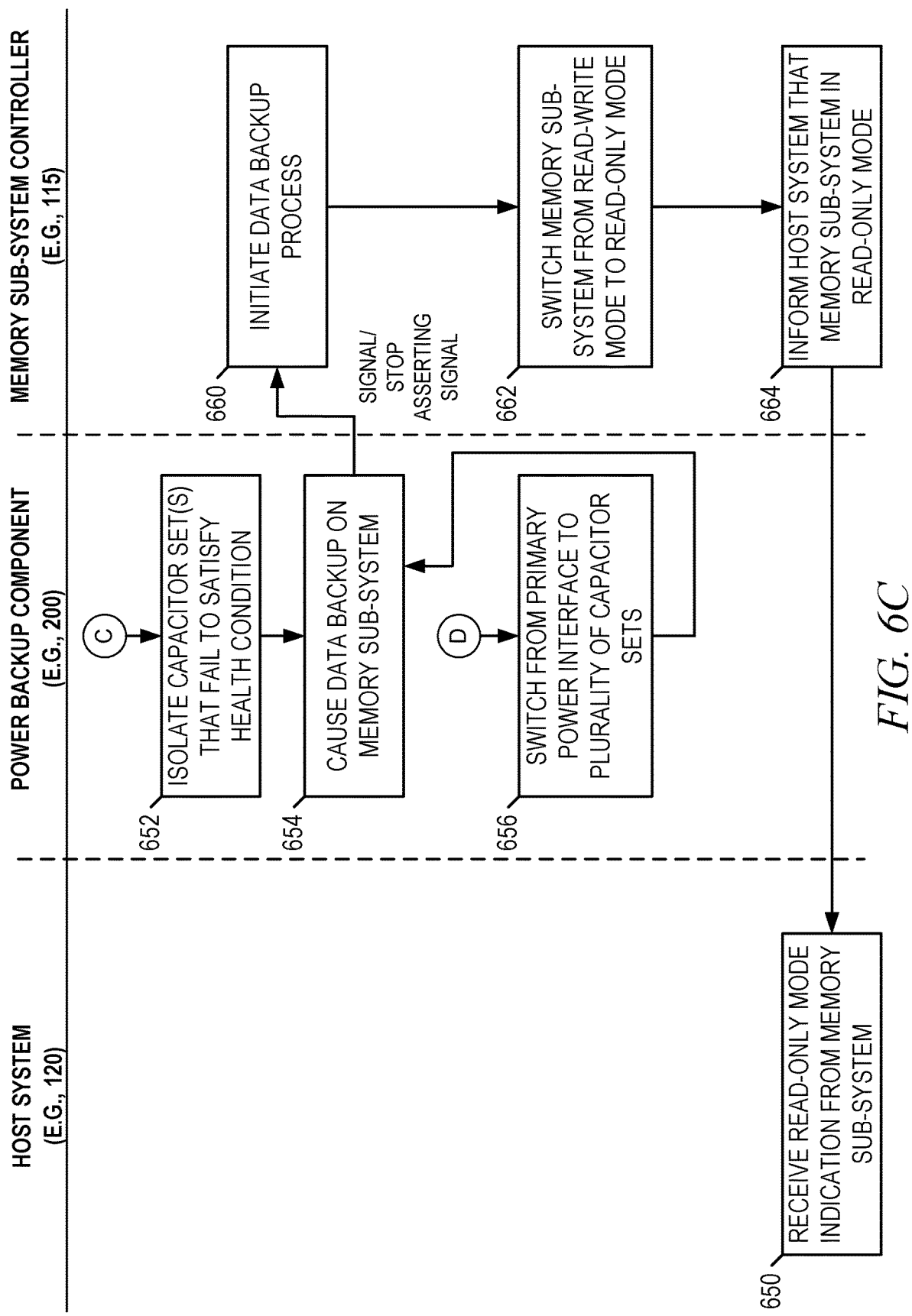

FIGS. 6A through 6C provide an interaction diagram illustrating interactions between components of the computing environment 100 in the context of some embodiments in which a method for managing capacitor health with respect to a power backup architecture is performed. The operations of the method can be performed by processing logic that can include hardware (e.g., a processing device, circuitry, dedicated logic, programmable logic, microcode, hardware of a device, an integrated circuit, etc.), software (e.g., instructions run or executed on a processing device), or a combination thereof. In some embodiments, the method is performed by a host system (e.g., 120), a power backup component (e.g., 200), a memory sub-system controller (e.g., 115), or a combination of both. Although the operations are shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. In the context of the example illustrated in FIG. 6, the host system can comprise the host system 120, the power backup component can comprise the power backup component 200, and the memory sub-system controller can comprise the memory sub-system controller 115.

As shown in FIG. 6, at operation 610, the power backup component 200 performs a power-up process and causes primary power to be provided to the memory sub-system controller 115. In response to receiving primary power, the memory sub-system controller 115 performs a power-up process, which causes the memory sub-system controller 115 to start the memory sub-system in read-only mode at operation 620 and inform the host system 120 that the memory sub-system is in read-only mode at operation 622. At operation 602, the host system 120 receives an indication that the memory sub-system is in read-only mode.

At operation 612, the power backup component 200 determines whether primary power interface is receiving power (e.g., from the host system 120) and, if so, the power backup component 200 determines whether at least one capacitor set (e.g., each capacitor set) of a plurality of capacitor sets satisfies a health condition. At operation 616, the power backup component 200 causes the plurality of capacitor sets to be charged based on the determination at operation 614. Additionally, at operation 632, the power backup component 200 generates a signal based on the determination at operation 614. At operation 636, the memory sub-system controller 115 receives the signal from the power backup component 200 at operation 636 and, in response, switches the memory subs-system from read-only mode to read-write mode. Subsequently, at operation 640, the memory sub-system controller 115 informs the host system 120 that the memory sub-system is in read-write mode. At operation 630, the host system 120 receives an indication that the memory sub-system is in read-write mode.

At operation 634, the power backup component 200 commences periodic determination of whether at least one capacitor set (e.g., each capacitor set) of the plurality of capacitor sets satisfies the health condition, and periodic determination of whether the primary power interface is receiving power. In response to determining that at least one capacitor set fails to satisfy the health condition (or in response to a number of capacitor sets failing to satisfy the health condition transgressing a threshold number) at operation 634, the power backup component 200 isolates one or more of the capacitor sets that fail to satisfy the health condition at operation 652. Additionally, at operation 654, the power backup component 200 causes a data backup process to be performed on the memory sub-system. Depending on the embodiment, the power backup component 200 can perform operation 654 by generating a signal to the memory sub-system controller 115 that indicates failure of at least one capacitor set (or the number of capacitor sets failing to satisfy the health condition transgressing a threshold number). Alternatively, the power backup component 200 can perform operation 654 by stopping assertion of the signal received by the memory sub-system controller 115 at operation 636, which can start assertion by the power backup component 200 at operation 632.

In response to determining that the memory sub-system stops receiving power (e.g., from the host system 120) at operation 634, the power backup component 200 switches power for the memory sub-system from power provided by the primary power interface to power provided by the plurality of capacitor sets at operation 656. After operation 656, operation 654 can be performed by power backup component 200.

In response to operation 654, the memory sub-system 115 initiates a data backup process on the memory sub-system at operation 660 and, subsequently, switch the memory sub-system from read-write mode to read-only mode. At operation 664, the memory sub-system controller 115 informs the host system 120 that the memory sub-system is in read-only mode. At operation 650, the host system 120 receives an indication that the memory sub-system is in read-only mode.

Figure 7:
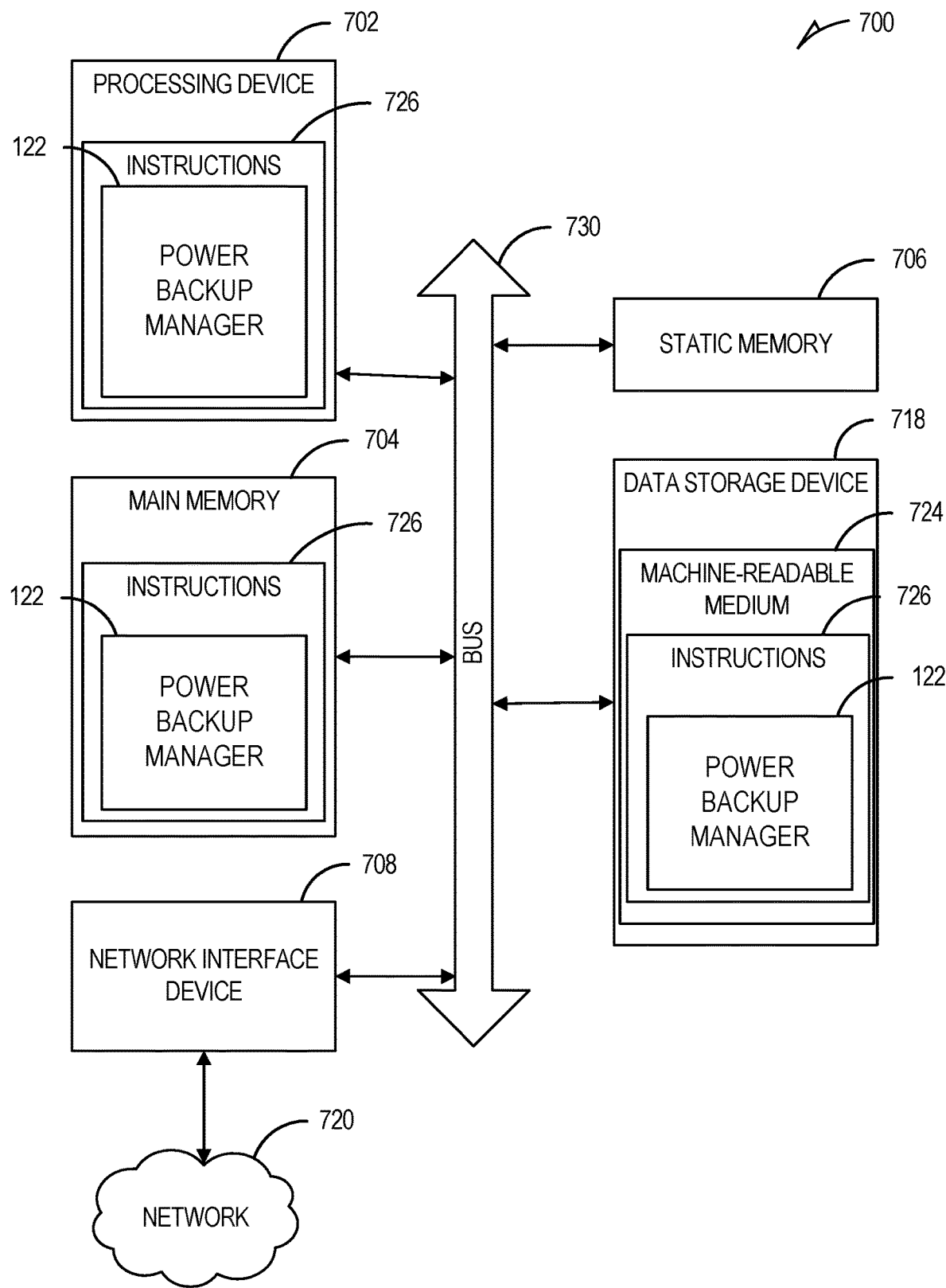
FIG. 7 is a block diagram illustrating a diagrammatic representation of a machine in the form of a computer system within which a set of instructions can be executed for causing the machine to perform any one or more of the methodologies discussed herein, in accordance with some embodiments of the present disclosure.

FIG. 7 illustrates an example machine in the form of a computer system 700 within which a set of instructions can be executed for causing the machine to perform any one or more of the methodologies discussed herein. In some embodiments, the computer system 700 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the power backup manager 122 of FIG. 1). In alternative embodiments, the machine can be connected (e.g., networked) to other machines in a local area network (LAN), an intranet, an extranet, and/or the Internet. The machine can operate in the capacity of a server or a client machine in a client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a network switch, a network bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 700 includes a processing device 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a data storage device 718, which communicate with each other via a bus 730.

The processing device 702 represents one or more general-purpose processing devices such as a microprocessor, a central processing unit, or the like. More particularly, the processing device 702 can be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing device 702 can also be one or more special-purpose processing devices such as an application specific integrated circuit (ASIC), a field programmable gate array (FPGA), a digital signal processor (DSP), a network processor, or the like. The processing device 702 is configured to execute instructions 726 for performing the operations and steps discussed herein. The computer system 700 can further include a network interface device 708 to communicate over a network 720.

The data storage device 718 can include a machine-readable storage medium 724 (also known as a computer-readable medium) on which is stored one or more sets of instructions 726 or software embodying any one or more of the methodologies or functions described herein. The instructions 726 can also reside, completely or at least partially, within the main memory 704 and/or within the processing device 702 during execution thereof by the computer system 700, the main memory 704 and the processing device 702 also constituting machine-readable storage media. The machine-readable storage medium 724, data storage device 718, and/or main memory 704 can correspond to the memory sub-system 110 of FIG. 1.

In one embodiment, the instructions 726 include instructions to implement functionality corresponding to managing capacitor health with respect to a power backup architecture as described herein (e.g., the power backup manager 122 of FIG. 1). While the machine-readable storage medium 724 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system's memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer-readable storage medium, such as, but not limited to, any type of disk including floppy disks, optical disks, CD-ROMs, and magnetic-optical disks; read-only memories (ROMs); random access memories (RAMs); erasable programmable read-only memories (EPROMs); EEPROMs; magnetic or optical cards; or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description above. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine-readable (e.g., computer-readable) storage medium such as a read-only memory (ROM), random access memory (RAM), magnetic disk storage media, optical storage media, flash memory components, and so forth.

In the foregoing specification, embodiments of the disclosure have been described with reference to specific example embodiments thereof. It will be evident that various modifications can be made thereto without departing from embodiments of the disclosure as set forth in the following claims. The specification and drawings are, accordingly, to be regarded in an illustrative sense rather than a restrictive sense.

EXAMPLES

Example 1 is a system comprising: a plurality of capacitor sets; a primary power interface; and a processing device, coupled to the plurality of capacitor sets and the primary power interface, the processing device configured to perform operations comprising: determining whether the primary power interface is receiving power from an external power source; and while the primary power interface is receiving power from the external power source: determining whether at least one capacitor set of the plurality of capacitor sets satisfies a health condition; causing one or more of the plurality of capacitor sets to be charged based on the determining whether the at least one capacitor set satisfies the health condition; and generating a signal based on the determining whether the at least one capacitor set satisfies the health condition.

In Example 2, the subject matter of Example 1 optionally includes where the signal causes the system to switch from a read-only mode to a read-write mode.

In Example 3, the subject matter of Example 1 or Example 2 optionally includes where the generating the signal based on the determining whether the at least one capacitor set satisfies the health condition comprises: in response to determining that each capacitor set in the plurality of capacitor sets has satisfied the health condition, generating the signal to indicate that each capacitor set in the plurality of capacitor sets has satisfied the health condition.

In Example 4, the subject matter of any one of Examples 1 to 3 optionally includes where the causing the plurality of capacitor sets to be charged based on the determining whether the at least one capacitor set satisfies the health condition comprises: in response to determining that each capacitor set in the plurality of capacitor sets has satisfied the health condition, causing all of the plurality of capacitor sets to charge.

In Example 5, the subject matter of any one of Examples 1 to 4 optionally includes where the causing the plurality of capacitor sets to be charged based on the determining whether the at least one capacitor set satisfies the health condition further comprises: after all of the plurality of capacitor sets has satisfied a charge condition, causing a memory device to switch from read-only mode.

In Example 6, the subject matter of any one of Examples 1 to 5 optionally includes where the causing the plurality of capacitor sets to be charged based on the determining whether the at least one capacitor set satisfies the health condition comprises: in response to determining that at least one capacitor set in the plurality of capacitor sets fails to satisfy the health condition, causing a capacitor set in the plurality of capacitor sets that satisfies the health condition to charge, the signal indicating that at least one capacitor set has failed to satisfy the health condition.

In Example 7, the subject matter of any one of Examples 1 to 6 optionally includes where the system further comprise: a plurality of memory devices, the processing device being coupled to the plurality of memory devices, and the operations further comprising: in response to the signal indicating that at least one capacitor set has failed to satisfy the health condition, causing data that is awaiting persistent storage to be written to the memory device.

In Example 8, the subject matter of any one of Examples 1 to 7 optionally includes where the system further comprises: a plurality of memory devices, the processing device being coupled to the plurality of memory devices, and the operations further comprising: in response to the signal indicating that at least one capacitor set has failed to satisfy the health condition, causing at least one of the plurality of memory devices to switch to read-only mode.

In Example 9, the subject matter of any one of Examples 1 to 8 optionally includes where the system further comprises: a memory device to store data; and a memory sub-system controller operatively coupled to the memory device to manage the memory device, the processing device being operatively coupled to the memory sub-system controller to control power to the memory sub-system controller.

In Example 10, the subject matter of any one of Examples 1 to 9 optionally includes where the generating the signal based on the determining whether the at least one capacitor set satisfies the health condition comprises: in response to determining that a number of capacitor sets in the plurality of capacitor sets that fail to satisfy the health condition does not transgress a threshold number of capacitor sets, generating the signal to indicate that a sufficient number of capacitor set in the plurality of capacitor sets has satisfied the health condition, the threshold number being less than all of capacitor sets in the plurality of capacitor sets.

In Example 11, the subject matter of any one of Examples 1 to 10 optionally includes where the causing the plurality of capacitor sets to be charged based on the determining whether the at least one capacitor set satisfies the health condition comprises: in response to determining that a number of capacitor sets in the plurality of capacitor sets that fail to satisfy the health condition does not transgress a threshold number of capacitor sets, causing each particular capacitor set in the plurality of capacitor sets that satisfies the health condition to charge, the threshold number being less than all of capacitor sets in the plurality of capacitor sets.

In Example 12, the subject matter of any one of Examples 1 to 11 optionally includes where the generating the signal is performed after each particular capacitor has satisfied a charge condition.

In Example 13, the subject matter of any one of Examples 1 to 12 optionally includes where the system further comprises: a memory device; and a memory sub-system controller operatively coupled to the memory device, the processing device being part of the memory sub-system controller.

In Example 14, the subject matter of any one of Examples 1 to 13 optionally includes where the system further comprises: a memory device, the processing device operatively being coupled to the memory device, and the operations further comprising: in response to determining that the primary power interface has stopped receiving power from the external power source, causing power to the memory device to switch from the primary power interface to at least one capacitor set of the plurality of capacitor sets.

In Example 15, the subject matter of any one of Examples 1 to 14 optionally includes where the operations further comprise: in response to determining that the primary power interface has stopped receiving power from the external power source, causing data that is awaiting persistent storage to be written to the memory device.

Example 16 is a method comprising: determining, by a power backup controller, whether each capacitor set in a plurality of capacitor sets satisfies a health condition, the plurality of capacitor sets being part of a memory sub-system; and in response to determining that a number of capacitor sets in the plurality of capacitor sets that fail the health condition does not transgress a threshold number of capacitor sets: causing, by the power backup controller, one or more of the plurality of capacitor sets to be charged based on the determining whether at least one capacitor set satisfies the health condition; and generating, by the power backup controller, a signal based on the determining whether the at least one capacitor set satisfies the health condition, the signal being configured for transmission to a memory sub-system controller of the memory sub-system.

In Example 17, the subject matter of Example 16 optionally includes where the threshold number is less than all of capacitor sets in the plurality of capacitor sets.

In Example 18, the subject matter of Example 16 or Example 17 optionally includes where the method further comprises: determining, at a power backup controller, whether a primary power interface of the memory sub-system is receiving power from a source external to the memory sub-system; and in response to determining that the primary power interface has stopped receiving power from the source: causing, by the power backup controller, power to a memory device of the memory sub-system to switch from the primary power interface to at least one capacitor set of the plurality of capacitor sets; and causing, by the memory sub-system controller, data that is awaiting persistent storage to be written to the memory device.

Example 19 is a non-transitory machine-readable storage medium comprising instructions that, when executed by a processing device, cause the processing device to perform operations comprising: determining whether at least one capacitor set of a plurality of capacitor sets of a memory sub-system satisfies a health condition; causing data that is awaiting persistent storage to be written to a memory device of the memory sub-system based on the determining whether the at least one capacitor set satisfies the health condition; and causing the memory device of the memory sub-system to switch to read-only mode based on the determining whether the at least one capacitor set satisfies the health condition.

In Example 20, the subject matter of Example 19 optionally includes where the operations further comprise: determining whether a primary power interface of the memory sub-system is receiving power from a source external to the memory sub-system; and in response to determining that the primary power interface has stopped receiving power from the source: causing power to the memory device of the memory sub-system to switch from the primary power interface to at least one capacitor set of the plurality of capacitor sets; and causing data that is awaiting persistent storage to be written to the memory device.

What is claimed is:
1. A memory sub-system comprising:
a plurality of capacitor sets;
a primary power interface;
a memory device to store data;
a memory sub-system controller operatively coupled to the memory device to manage the memory device; and
a power backup controller, operatively coupled to the memory sub-system controller, the plurality of capaci- tor sets, and the primary power interface, the power backup controller configured to perform operations comprising:

determining whether the primary power interface is receiving power from an external power source; and while the primary power interface is receiving power from the external power source:

determining whether each capacitor set in the plurality of capacitor sets satisfies or fails to satisfy a health condition;

causing each capacitor set, in the plurality of capacitor sets, that satisfies the health condition to be charged;

periodically performing a test process on each capacitor set in the plurality of capacitor sets, the test process for each capacitor set comprising charging a capacitor set to a certain charge level, measuring a test discharge rate of the capacitor set from the certain charge level, and storing the test discharge rate;

periodically determining whether each capacitor set in the plurality of capacitor sets satisfies or fails to satisfy the health condition, wherein the capacitor set fails to satisfy the health condition if based on stored test discharge rates, a rate at which a discharge rate of the capacitor set has changed over time indicates imminent failure of the capacitor set; and generating a signal to the memory sub-system controller based on the determining of whether each capacitor set in the plurality of capacitor sets satisfies or fails to satisfy the health condition, the memory sub-system controller being configured to:

in response to the signal indicating that each capacitor set in the plurality of capacitor sets satisfies the health condition, cause the memory sub-system to switch from a read-only mode to a read-write mode;

in response to the signal indicating that at least one capacitor set in the plurality of capacitor sets fails to satisfy the health condition, cause data that is awaiting persistent storage to be written to the memory device and switch the memory sub-system to the read-only mode.

2. The memory sub-system of claim 1, wherein the generating of the signal based on the determining of whether each capacitor set in the plurality of capacitor sets satisfies or fails to satisfy the health condition comprises: in response to determining that each capacitor set in the plurality of capacitor sets satisfies the health condition, generating the signal to indicate that each capacitor set in the plurality of capacitor sets satisfies the health condition.

3. The memory sub-system of claim 1, wherein the causing of each capacitor set, in the plurality of capacitor sets, that satisfies the health condition to be charged comprises:

in response to determining that each capacitor set in the plurality of capacitor sets satisfies the health condition, causing all of the plurality of capacitor sets to charge.

4. The memory sub-system of claim 3, wherein the causing of each capacitor set, in the plurality of capacitor sets, that satisfies the health condition to be charged comprises:

after all of the plurality of capacitor sets satisfies a charge condition, causing the memory device to switch from the read-only mode.

5. The memory sub-system of claim 1, wherein the causing of each capacitor set, in the plurality of capacitor sets, that satisfies the health condition to be charged comprises:

in response to determining that at least one capacitor set in the plurality of capacitor sets fails to satisfy the health condition, causing a capacitor set in the plurality of capacitor sets that satisfies the health condition to charge, the signal being generated to indicate that at least one capacitor set has failed to satisfy the health condition.

6. The memory sub-system of claim 1, wherein the generating of the signal based on the determining of whether each capacitor set in the plurality of capacitor sets satisfies or fails to satisfy the health condition comprises:

in response to determining that a number of capacitor sets in the plurality of capacitor sets that fail to satisfy the health condition does not transgress a threshold number of capacitor sets, generating the signal to indicate that a sufficient number of capacitor set in the plurality of capacitor sets has satisfied the health condition, the threshold number being less than all of capacitor sets in the plurality of capacitor sets.

7. The memory sub-system of claim 1, wherein the causing of each capacitor set, in the plurality of capacitor sets, that satisfies the health condition to be charged comprises:

in response to determining that a number of capacitor sets in the plurality of capacitor sets that fail to satisfy the health condition does not transgress a threshold number of capacitor sets, causing each particular capacitor set in the plurality of capacitor sets that satisfies the health condition to charge, the threshold number being less than all of capacitor sets in the plurality of capacitor sets.

8. The memory sub-system of claim 7, wherein the generating of the signal is performed after each particular capacitor has satisfied a charge condition.

9. The memory sub-system of claim 1, wherein the operations further comprise:

in response to determining that the primary power interface has stopped receiving power from the external power source, causing power to the memory device and the memory sub-system controller to switch from the primary power interface to at least one capacitor set in the plurality of capacitor sets.

10. The memory sub-system of claim 9, wherein the signal is a first signal and the operations further comprise:

in response to determining that the primary power interface has stopped receiving power from the external power source, generating a second signal to the memory sub-system controller, the second signal indicating that a power failure event has occurred, the memory sub-system controller being configured to cause data that is awaiting persistent storage to be written to the memory device in response to the second signal.

11. A method comprising:

determining, by a power backup controller, whether a primary power interface is receiving power from an external power source, in a memory sub-system comprising the power backup controller, the primary power interface, a plurality of capacitor sets, a memory device to store data, and a memory sub-system controller to manage the memory device; and while the primary power interface is receiving power from the external power source:

determining whether each capacitor set, in the plurality of capacitor sets, satisfies or fails to satisfy a health condition;

causing, by the power backup controller, each capacitor set, in the plurality of capacitor sets, that satisfies the health condition to be charged;

periodically performing a test process on each capacitor set in the plurality of capacitor sets, the test process for each capacitor set comprising charging a capacitor set to a certain charge level, measuring a test discharge rate of the capacitor set from the certain charge level, and storing the test discharge rate;

periodically determining, by the power backup controller, whether each capacitor set, in the plurality of capacitor sets, satisfies or fails to satisfy the health condition, wherein the capacitor set fails to satisfy the health condition if based on stored test discharge rates, a rate at which a discharge rate of the capacitor set has changed over time indicates imminent failure of the capacitor set; and in response to determining that a number of capacitor sets in the plurality of capacitor sets that fail to satisfy the health condition does not transgress a threshold number of capacitor sets:

generating, by the power backup controller, a signal to the memory sub-system controller based on the determining of whether each capacitor set satisfy or fails to satisfy the health condition, the memory sub-system being configured to:

in response to the signal indicating that each capacitor set in the plurality of capacitor sets satisfies the health condition, cause the memory sub-system to switch from a read-only mode to a read-write mode;

in response to the signal indicating at least one capacitor set in the plurality of capacitor sets fails to satisfy the health condition, cause data that is awaiting persistent storage to be written to the memory device and switch the memory sub-system to the read-only mode.

12. The method of claim 11, wherein the threshold number is less than all of capacitor sets in the plurality of capacitor sets.

13. The method of claim 11, wherein the signal is a first signal and the method further comprises:

in response to determining that the primary power interface has stopped receiving power from the source:

causing, by the power backup controller, power to the memory device and the memory sub-system controller to switch from the primary power interface to at least one capacitor set in the plurality of capacitor sets; and generating, by the power backup controller, a second signal to the memory sub-system controller, the second signal indicating that a power failure event has occurred, the memory sub-system controller being configured to cause data that is awaiting persistent storage to be written to the memory device in response to the second signal.

14. The method of claim 11, wherein the generating of the signal based on the determining of whether each capacitor set in the plurality of capacitor sets satisfies or fails to satisfy the health condition comprises:

in response to determining that each capacitor set in the plurality of capacitor sets satisfies the health condition, generating the signal to indicate that each capacitor set in the plurality of capacitor sets satisfies the health condition.

15. The method of claim 11, wherein the causing of each capacitor set, in the plurality of capacitor sets, that satisfies the health condition to be charge comprises:

in response to determining that each capacitor set in the plurality of capacitor sets satisfies the health condition, causing all of the plurality of capacitor sets to charge.

16. The method of claim 15, wherein the causing of each capacitor set, in the plurality of capacitor sets, that satisfies the health condition to be charged further comprises:

after all of the plurality of capacitor sets satisfies a charge condition, causing the memory device to switch from the read-only mode.

17. The method of claim 11, wherein the causing of each capacitor set, in the plurality of capacitor sets, that satisfies the health condition to be charged comprises:

in response to determining that at least one capacitor set in the plurality of capacitor sets tails to satisfy the health condition, causing a capacitor set in the plurality of capacitor sets that satisfies the health condition to charge, the signal being generated to indicate that at least one capacitor set has failed to satisfy the health condition.

18. The method of claim 11, wherein the generating of the signal based on the determining whether each capacitor set in the plurality of capacitor sets satisfies or fails to satisfy the health condition comprises:

in response to determining that the number of capacitor sets in the plurality of capacitor sets that fail to satisfy the health condition does not transgress a threshold number of capacitor sets, generating the signal to indicate that a sufficient number of capacitor set in the plurality of capacitor sets has satisfied the health condition, the threshold number being less than all of capacitor sets in the plurality of capacitor sets.

19. A non-transitory machine-readable storage medium comprising instructions that, when executed by a power backup controller of a memory sub-system, cause the power backup controller to perform operations comprising:

determining whether each capacitor set in a plurality of capacitor sets satisfies or fails to satisfy a health condition;

causing each of the plurality of capacitor sets that satisfy the health condition to be charged;

periodically performing a test process on each capacitor set in the plurality of capacitor sets, the test process for each capacitor set comprising charging a capacitor set to a certain charge level, measuring a test discharge rate of the capacitor set from the certain charge level, and storing the test discharge rate;

periodically determining at each capacitor set in the plurality of capacitor sets whether the capacitor set satisfy or fails to satisfy the health condition, wherein the capacitor set fails to satisfy the health condition if based on stored test discharge rates, a rate at which a discharge rate of the capacitor s has changed over time indicates imminent failure of the capacitor set; and generating a signal to a memory sub-system controller of the memory sub-system based on the determining of whether each capacitor set in the plurality of capacitor sets satisfies or fails to satisfy the health condition, the memory sub-system controller being configured to:

in response to the signal indicating that each capacitor set in the plurality of capacitor sets satisfies the health condition, cause the memory sub-system to switch from a read-only mode to a read-write mode;

in response to the signal indicating that at least one capacitor set in the plurality of capacitor sets fails to satisfy the health condition, cause data that is awaiting persistent storage to be written to a memory device of the memory sub-system and switch the memory sub-system to a read-only mode.

20. The non-transitory machine-readable storage medium of claim 19, wherein the operations further comprising:

determining whether a primary power interface of the memory sub-system is receiving power from a source external to the memory sub-system; and in response to determining that the primary power interface has stopped receiving power from the source:

causing power to the memory device and the memory sub-system controller to switch from the primary power interface to at least one capacitor set in the plurality of capacitor sets; and causing data that is awaiting persistent storage to be written to the memory device.

* * * * *